(12) United States Patent
Kubota (10) Patent No.: US 10,345,704 B2
(45) Date of Patent: Jul. 9, 2019

(54) PHOTOSENSITIVE ELEMENT (71) Applicant: HITACHI CHEMICAL COMPANY, LTD., Chiyoda-ku, Tokyo (JP)

(72) Inventor: Masao Kubota, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/618,042

(22) Filed: Feb. 10, 2015

(65) Prior Publication Data
US 2015/0227042 A1  Aug. 13, 2015

(30) Foreign Application Priority Data
Feb. 12, 2014 (JP) ................. 2014-024320

(51) Int. Cl.
| | | |
|---|---|---|
| G03F 7/30 | (2006.01) | |
| G03F 7/032 | (2006.01) | |
| G03F 7/028 | (2006.01) | |
| G03F 7/36 | (2006.01) | |
| G03F 7/20 | (2006.01) | |
| G03F 7/09 | (2006.01) | |
| G03F 7/40 | (2006.01) | |

(52) U.S. Cl.
CPC ........... *G03F 7/30* (2013.01); *G03F 7/028* (2013.01); *G03F 7/032* (2013.01); *G03F 7/09* (2013.01); *G03F 7/092* (2013.01); *G03F 7/2002* (2013.01); *G03F 7/36* (2013.01); *G03F 7/40* (2013.01)

(58) Field of Classification Search
None
See application file for complete search history.

(56) References Cited

U.S. PATENT DOCUMENTS

| | | | | |
|---|---|---|---|---|
| 2009/0205860 A1* | 8/2009 | Kobayashi | ........... | H05K 1/0266 174/260 |
| 2010/0112481 A1* | 5/2010 | Kubota | ........... | G03F 7/09 430/286.1 |
| 2013/0146346 A1* | 6/2013 | Nakamoto | ........... | G03F 7/004 174/258 |
| 2013/0266900 A1* | 10/2013 | Kubota | ........... | G03F 7/09 430/285.1 |
| 2013/0337161 A1* | 12/2013 | Akimoto | ........... | C09C 3/006 427/162 |

(Continued)

FOREIGN PATENT DOCUMENTS

| | | |
|---|---|---|
| CN | 1945429 A | 4/2007 |
| JP | 7-333853 A | 12/1995 |

(Continued)

OTHER PUBLICATIONS

English language machine translation of JP 2007-101940 to Mori et al.

*Primary Examiner* — Sin J Lee
(74) *Attorney, Agent, or Firm* — Fitch, Even, Tabin & Flannery, L.L.P.

(57) ABSTRACT

The present invention relates to a photosensitive element comprising a support film, and a photosensitive layer on the support film, wherein a haze of the support film is 0.01 to 1.0% and a total light transmittance thereof is 90% or more, and the photosensitive layer contains a binder polymer, a photopolymerizable compound having an ethylenically unsaturated bond, and a photopolymerization initiator.

12 Claims, 4 Drawing Sheets

(56) References Cited

U.S. PATENT DOCUMENTS

| | | | | |
|---|---|---|---|---|
| 2014/0221568 A1* | 8/2014 | Kikuta | ....................... | C08J 5/18 |
| | | | | 524/747 |
| 2015/0079379 A1* | 3/2015 | Suzuki | .................. | C08F 290/06 |
| | | | | 428/220 |

FOREIGN PATENT DOCUMENTS

| | | | |
|---|---|---|---|
| JP | 11-327137 A | | 11/1999 |
| JP | 2007-101940 A | | 4/2007 |
| JP | 2008-122920 A | | 5/2008 |
| JP | 4905465 B2 | | 1/2012 |
| TW | 201241568 A1 | | 10/2012 |
| WO | 00/79344 A1 | | 12/2000 |
| WO | 2009/125752 A1 | | 10/2009 |
| WO | WO 2012/081680 A1 | * | 6/2012 |
| WO | WO 2012/115057 A1 | * | 8/2012 |
| WO | WO 2013/011828 A1 | * | 1/2013 |
| WO | WO 2013/187508 A1 | * | 12/2013 |

* cited by examiner

PHOTOSENSITIVE ELEMENT

TECHNICAL FIELD

The present invention relates to a photosensitive element, a method for forming a resist pattern, and a method for producing a printed-wiring board.

BACKGROUND

A photosensitive element including a layer formed from a photosensitive resin composition (hereinafter, referred to as "photosensitive layer"), a support film and a protective film has been conventionally widely used as a resist material for etching, plating and the like in the production field of a printed-wiring board and the high-precision processing field of metal.

The printed-wiring board is produced as follows, for example. First, the protective film of the photosensitive element is peeled from the photosensitive layer, and thereafter the photosensitive layer is laminated on a conductive film of a circuit-forming board. Then, the photosensitive layer is subjected to pattern exposure, thereafter an unexposed region is removed by a developing solution, and a resist pattern is formed. Then, an etching treatment or a plating treatment is conducted based on this resist pattern to pattern the conductive film, thereby forming the printed-wiring board.

As this developing solution used for removal of the unexposed region, an alkaline development type such as a sodium carbonate solution is mainly used. The developing solution may usually have the ability to dissolve the photosensitive layer, and the photosensitive layer is dissolved in the developing solution or dispersed in the developing solution during development.

In accordance with miniaturization of patterning of the conductive film in recent years, the photosensitive layer of the photosensitive element has been demanded to have excellent adhesiveness for the circuit-forming board and high resolution for resist pattern formation.

Usually, when a resist is formed using the photosensitive element, the photosensitive layer is laminated on the board and then exposed with the support film being not peeled. In order to address with such an exposure treatment, a light-permeable material may be adopted for the support film. In addition, in order to achieve a high resolution in pattern formation, the support film is required to be as thin as possible. On the other hand, in order to coat the support film with the photosensitive resin composition in a uniform thickness at a high yield, the support film is demanded to have a certain thickness (generally 10 μm to 30 μm). In addition, for the purpose of the enhancement in productivity of the support film, namely, the enhancement in winding property of the support film, the support film generally contains inorganic particles or organic particles. Therefore, the conventional support film has the following tendency: the haze thereof is increased, particles contained in the support film cause light scattering in exposure, and the photosensitive film cannot respond to a demand for a higher resolution.

As a method for achieving a higher resolution, there is a method in which the support film with which the photosensitive element is provided is peeled before exposure and exposure is conducted with no support film interposed. In this case, a phototool may directly adhere to the photosensitive layer. The photosensitive layer, however, usually has some level of adhesiveness, and thus the phototool adhering thereto is difficult to remove when the phototool directly adheres to the photosensitive layer and exposure is performed. In addition, the phototool is contaminated by the photosensitive layer and the support film is peeled to thereby cause the photosensitive layer to be exposed to oxygen in the air, easily resulting in a reduction in photosensitivity.

In order to overcome the above points, various measures have been proposed. For example, in JP 07-333853 A, WO 2000/079344 A and JP 4905465 B, the following has been proposed: the size of a particle included in a support film and the haze of the support film are within specific ranges to thereby allow a resist pattern excellent in resolution and the like to be formed.

SUMMARY

Recently, a projection type exposure machine has been increasingly used in the production field of a printed-wiring board having supermicro wiring. In the case where the projection type exposure machine is used, the exposure illuminance tends to be higher and the exposure time tends to be shorter as compared with a contact type exposure machine conventionally used. On the other hand, when a high-performance projection type exposure machine, namely, a projection type exposure machine whose numerical aperture (also referred to as "brightness of projector lens") is small is used among projection type exposure machines, pinholes may be generated in a resist pattern after development.

The present invention has been made under the circumstances, and an object thereof is to provide a photosensitive element that enables generation of pinholes to be sufficiently suppressed even in the case where a projection type exposure machine whose numerical aperture is small is used.

The present invention provides a photosensitive element comprising a support film, and a photosensitive layer formed on the support film, wherein a haze of the support film is 0.01 to 1.0% and a total light transmittance of the support film is 90% or more, and the photosensitive layer contains a binder polymer, a photopolymerizable compound having an ethylenically unsaturated bond, and a photopolymerization initiator.

The present invention also provides a method for forming a resist pattern, comprising a photosensitive layer formation step of using the photosensitive element to form the photosensitive layer on a circuit-forming board, an exposure step of irradiating a predetermined region of the photosensitive layer with an active ray to form a photo-cured region, and a development step of removing an unexposed region other than the photo-cured region.

The present invention also provides a method for forming a resist pattern, comprising a lamination step of laminating the photosensitive element on a circuit-forming board in order from the photosensitive layer to the support film, an exposure step of irradiating a predetermined region of the photosensitive layer with an active ray through the support film to form a photo-cured region, and a development step of removing an unexposed region other than the photo-cured region.

The present invention further provides a method for producing a printed-wiring board, comprising a step of etching or plating a circuit-forming board having a resist pattern formed by the method for forming a resist pattern.

According to the present invention, it is possible to provide a photosensitive element that enables generation of pinholes to be sufficiently suppressed even in the case where a projection type exposure machine whose numerical aperture is small is used.

DETAILED DESCRIPTION

Hereinafter, suitable embodiments of the present invention are described in detail with reference to the drawings if necessary. Herein, the same member is denoted by the same symbol in the drawings, and the overlapping description is omitted. In addition, the positional relationship in the up/down and left/right directions is based on the positional relationship illustrated in the drawings, unless otherwise particularly noted. Furthermore, the dimensional ratio in the drawings is not limited to the ratio illustrated. In addition, needless to say, in the following embodiments, their constituents (also including constituent steps) are not necessarily essential, unless otherwise clearly indicated and considered to be in principle clearly essential. This is true for numerical values and ranges, and should be construed not to unfairly limit the present disclosure. Herein, the term "(meth)acrylate" means "acrylate" or "methacrylate" corresponding thereto. This is true for other similar expressions such as "(meth)acrylic acid" and "(meth)acryloyl".

In the present specification, the term "layer" encompasses not only a structure of a shape formed on the whole surface but also a structure of a shape formed on a part thereof, when observed as a plan view. In the present specification, the term "step" encompasses not only an independent step but also a step as long as the step achieves a given object even if the step cannot be clearly distinguished from other steps. In the present specification, the numerical value range represented by using "to" represents a range including the numerical values given before and after "to" as the maximum and minimum, respectively. In addition, the term such as "first" or "second" is used to distinguish one constituent from other constituents, and such a constituent is not intended to be limited by such a term.

It has been found from studies by the present inventors that, in the above conventional photosensitive elements described in JP 07-333853 A, WO 2000/079344 A and JP 4905465 B, when a projection type exposure machine conventionally used, whose numerical aperture is large, is used, no pinholes are generated in a resist pattern after development, but when a projection type exposure machine whose numerical aperture is small is used, pinholes are generated in a resist after development.

The present inventors have made detailed studies about a cause for generation of pinholes in a resist after development. First, each of a contact type exposure machine and a projection type exposure machine is used to confirm the influence of the difference in exposure system on generation of pinholes. The projection type exposure machine used in this study is a high-performance machine (whose numerical aperture is small) with a resolution of 5 µm ensured. As a result, it has been found that even in the case where a photosensitive element, with no pinhole failures observed in use of the contact type exposure machine, is used, pinholes of about 2 to 3 µm are generated by use of the projection type exposure machine. In addition, when a photosensitive element in which pinholes are generated by the contact type exposure machine is used and exposed by the projection type exposure machine, the number of pinholes generated tends to be significantly increased.

Then, the influence of the type of the support film on generation of pinholes is confirmed. The optical transmittance and the haze of the support film affect a particle included in the support film, and it is thus considered that generation of pinholes is caused by the particle included in the support film. It is presumed by the present inventors that in the case where a projection type exposure machine whose numerical aperture is small is used, the particle included in the support film serves as a black dot to cause the photosensitive layer not to be exposed, generating pinholes in a resist pattern after development. On the other hand, it is presumed that when a projection type exposure machine conventionally used, whose numerical aperture is large, is used, an image projected on the surface of the photosensitive layer is hardly focused, making it difficult to generate pinholes in a resist pattern after development. Then, a support film having specific optical transmittance and haze is adopted to thereby complete a photosensitive element that enables generation of pinholes to be sufficiently suppressed even in the case where a projection type exposure machine whose numerical aperture is small is used.

A photosensitive element of the present embodiment is a photosensitive element including a support film and a photosensitive layer formed on the support film, wherein the haze of the support film is 0.01 to 1.0% and the total light transmittance of the support film is 90% or more.

Figure 1:
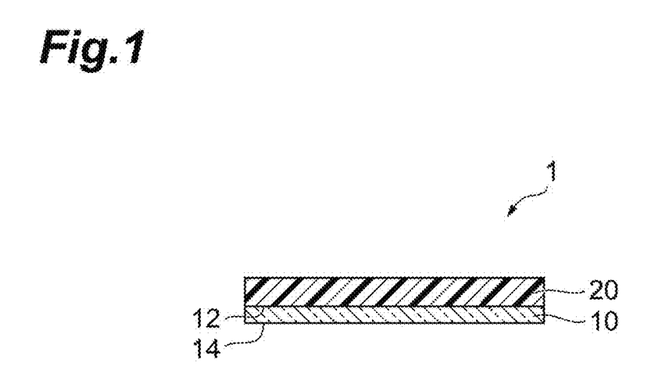
FIG. 1 is a schematic cross-sectional view illustrating a suitable embodiment of the photosensitive element of the present invention.

FIG. 1 is a schematic cross-sectional view illustrating one suitable embodiment of the photosensitive element. A photosensitive element 1 illustrated in FIG. 1 includes a support film 10 and a photosensitive layer 20. The photosensitive layer 20 is provided on a first main surface 12 of the support film 10. In addition, the support film 10 has a second main surface 14 located opposite to the first main surface 12.

(Support Film)

The support film 10 has a haze of 0.01 to 1.0% and a total light transmittance of 90% or more.

The haze of the support film 10 is preferably 0.01 to 0.9%, more preferably 0.01 to 0.8%, further preferably 0.01 to 0.7%. If the haze of the support film 10 is less than 0.01%, the support film itself tends not to be easily produced, and if the haze is more than 1.0%, the variability of a resist pattern tends to be increased. Herein, the term "haze" means the degree of cloudiness. The haze in the present embodiment refers to the value measured using a commercially available haze meter (turbidity meter) according to the method defined in JIS K 7136 (2000). The haze can be measured by a commercially available apparatus such as NDH-5000 (manufactured by Nippon Denshoku Industries Co., Ltd., product name).

The total light transmittance of the support film 10 is preferably 91% or more. If the total light transmittance of the support film 10 is less than 90%, pinholes having a diameter of 2 to 3 µm are easily generated in the case where a projection type exposure machine whose numerical aperture is small is used. The total light transmittance in the present embodiment refers to the value measured using a commercially available haze meter (turbidity meter) according to the method defined in JIS K 7361-1 (1997). The total light transmittance can be measured by a commercially available apparatus such as NDH-5000 (manufactured by Nippon Denshoku Industries Co., Ltd., product name).

The total number of a particle and an aggregate with a long diameter of 5 μm or more (hereinafter, simply referred to as the "particle and the like") included in the support film 10 is preferably 5/mm² or less. Herein, the particle and the like with a long diameter of 5 μm or more, included in the support film 10, encompass both of one protruded from the main surface of the support film and one present in the film. In addition, the particle and the like with a long diameter of 5 μm or more encompass a primary particle with a long diameter of 5 μm or more and an aggregate of a primary particle with a long diameter of less than 5 μm.

The particle and the like with a long diameter of 5 μm or more is preferably included in a number of 5/mm² or less, more preferably 3/mm² or less, further preferably 1/mm² or less. When the particle and the like are included in a number of 5/mm² or less, a partial loss of a resist (microdefects in the resist) after exposure and development is hardly generated. Then, when such a photosensitive element accompanied by a partial loss of a resist is used for a printed-wiring board, it contributes to generation of open failures in etching or generation of short circuit failures in plating, and such failures tend to reduce the production yield of a printed-wiring board.

Herein, the particle with a long diameter of less than 5 μm, if included in the support film 10 in a large number, does not have a large influence on light scattering. With respect to the reason therefor, in the case where the photosensitive layer is irradiated with light in an exposure step, the photo-curing reaction in the photosensitive layer not only progresses in a light irradiation region but also slightly progresses in the lateral direction (direction perpendicular to the light irradiation direction) not directly irradiated with light. Thus, it is considered that in the case where the particle diameter is small, the photo-curing reaction in the region immediately below the particle sufficiently progresses, but, as the particle diameter is larger, the photo-curing reaction in the region immediately below the particle does not sufficiently progress, resulting in generation of microdefects in the resist.

Herein, the particle and the like with a long diameter of 5 μm or more, included in the support film 10, are generated due to an aggregate formed by aggregation in film preparation of components forming the support film, such as a gel-like product of a polymer, a monomer as a raw material, a catalyst for use in production, and an inorganic particle or an organic particle included if necessary; a bulge by a lubricant and an adhesive, generated in coating the film with a particle-containing resin layer; the particle and the like with a long diameter of 5 μm or more, contained in the film. In order that the particle and the like with a long diameter of 5 μm or more is included in a number of 5/mm² or less, one having a small diameter or one excellent in dispersibility, of the particle and the like, may be selectively used.

The particle and the like with a long diameter of 5 μm or more can be counted from the thickness direction of the support film using a polarizing microscope. Herein, an aggregate formed by aggregation of a primary particle with a long diameter of 5 μm or more and a primary particle with a long diameter of less than 5 μm is counted as one. In addition, in the present specification, the "long diameter" of the particle and the like included in the support film refers to a length between any two points selected, on the outer profile line of the particle diagram of the particle and the like, so that the length therebetween is maximum in observation using a polarizing microscope, and also refers to the "maximum length".

The material of the support film 10 is not particularly limited as long as the haze is 0.01 to 1.0% and the total light transmittance is 90% or more. Examples of the support film 10 include a film including one or more resin materials selected from the group consisting of polyesters such as polyethylene terephthalate (hereinafter, designated as "PET") and polyolefins such as polypropylene and polyethylene.

The resin layer of the support film 10 may be of a single layer or a plurality of layers. For example, when a bilayer support film made of two resin layers is used, it is preferable for a bilayer film obtained by laminating a particle-containing resin layer on one surface of a biaxially oriented polyester film to be used as the support film, and a self-healing layer or a hard coat layer be provided on a surface on which the particle-containing resin layer is formed, and it is preferable for the photosensitive layer to be formed on a surface opposite to the surface on which the particle-containing resin layer is formed. In addition, a multi-layer support film made of three layers (for example, A layer/B layer/A layer) can also be used as the resin layer of the support film. The configuration of the resin layer of the support film is not particularly limited, but in view of sliding property of the film and the like, it is preferable for both outermost layers (A layers in the case of the above three layers) to be each a particle-containing layer.

Since a conventional bilayer support film is produced by coating a biaxially oriented polyester film with a particle-containing resin layer, the particle-containing resin layer is easily peeled in lamination of the photosensitive film, and the resin layer peeled can be attached to the photosensitive layer to contribute to failures. Therefore, it is preferable in the present embodiment to use a support film made of three layers, prepared by injection-molding the particle-containing resin layer on each of both surfaces of the biaxially oriented polyester film. It is possible to form a self-healing layer or a hard coat layer on the resin layer, by coating the resin layer with an appropriate curable compound using a known method such as roll coating, flow coating, spray coating, curtain flow coating, dip coating or slit die coating, and then curing the curable compound.

The above particle is preferably present at 0.01 to 50% by mass in the particle-containing resin layer. Then, as the above particle, for example, a particle produced from various nucleating agents in polymerization; an aggregated body; an inorganic particle such as a silicon dioxide particle (aggregated silica or the like), a calcium carbonate particle, an alumina particle, a titanium oxide particle or a barium sulfate particle; an organic particle such as a crosslinked polystyrene particle, an acrylic particle or an imide particle; and a mixture thereof can be used.

The particle-containing resin layer is not particularly limited as long as it can hold a particle on the support film, and may not be laminated on the material of the support film. In addition, a base resin forming the particle-containing resin layer may be the same as or different from the material of the support film described above.

In a multi-layer support film of three or more layers, one or more intermediate layers sandwiched between particle-containing outermost layers may contain the above particle or be free from the above particle, but is preferably free from the above particle from the viewpoint of an enhancement in resolution. In the case where each of the intermediate layers contains the above particle, the content in each of the intermediate layers is preferably ⅓ or less, more preferably ⅕ or less of the content in each of the outermost layers.

From the viewpoint of an enhancement in resolution, the thickness of the particle-containing resin layer is preferably 0.01 to 5 μm, more preferably 0.05 to 3 μm, further preferably 0.1 to 2 μm. Then, A surface of the outermost layer not facing the intermediate layers preferably has a static friction coefficient of 1.2 or less. When the static friction coefficient is 1.2 or less, wrinkles tend to be hardly caused in film production and in photosensitive element production, and static electricity tends to be hardly generated to thereby hardly cause contaminations to be attached. In the present embodiment, the static friction coefficient can be measured according to ASTMD1894.

Herein, in order that the particle and the like with a long diameter of 5 μm or more is included in the support film 10 in a number of $5/mm^2$ or less, it is preferable for the diameter of the particle in the particle-containing resin layer to be less than 5 μm. Then, in order to further reduce light scattering in exposure, it is preferable for the thickness of the particle-containing resin layer to be appropriately adjusted depending on the diameter of the particle.

Herein, the support film 10 may also include an antistatic agent and the like if necessary as long as photosensitive property thereof is not impaired.

The thickness of the support film 10 is preferably 5 to 200 μm, more preferably 8 to 100 μm, further preferably 10 to 80 μm, particularly preferably 12 to 60 μm. The thickness of the support film 10 is preferably 5 μm or more, more preferably 8 μm or more, further preferably 10 μm or more, particularly preferably 12 μm or more, because the support film 10 is hardly broken in peeling of the support film 10 from the photosensitive element 1. In addition, the thickness of the support film 10 is preferably 200 μm or less, more preferably 100 μm or less, further preferably 80 μm or less, particularly preferably 60 μm or less, because of excellently low cost.

In addition, as the support film 10, one usable as the support film of the photosensitive element 1, which is obtained among generally industrial films that are commercially available, may be appropriately processed and used. Examples of one usable as the support film 10, which is a generally industrial film that is commercially available, include PET films produced by Toray Industries Inc. (product names "U32" and "U48").

(Photosensitive Layer)

The photosensitive layer 20 is a layer formed from a photosensitive resin composition. The photosensitive resin composition forming the photosensitive layer 20 contains (A) a binder polymer, (B) a photopolymerizable compound having an ethylenically unsaturated bond, and (C) a photopolymerization initiator. Hereinafter, the above respective components are described in detail.

The binder polymer as the component (A) is not particularly limited as long as it is one for use in a conventional photosensitive resin composition, and examples include an acrylic resin, a styrene resin, an epoxy resin, an amide resin, an amide epoxy resin, an alkyd resin and a phenol resin. Among them, an acrylic resin is preferable from the viewpoint of an enhancement in alkali development property. These are used singly or in combination of two or more.

The binder polymer can be produced by radical polymerization of a polymerizable monomer. Examples of the polymerizable monomer include styrene, polymerizable styrene derivatives such as vinyl toluene, α-methylstyrene, p-methylstyrene and p-ethylstyrene, acrylamide, acrylonitrile, ethers of vinyl alcohols, such as vinyl-n-butyl ether, alkyl (meth)acrylates, benzyl (meth)acrylate, tetrahydrofuryl (meth)acrylate, dimethylaminoethyl (meth)acrylate, diethylaminoethyl (meth)acrylate, glycidyl (meth)acrylate, 2,2,2-trifluoroethyl (meth)acrylate, 2,2,3,3-tetrafluoropropyl (meth)acrylate, (meth)acrylic acid, α-bromo(meth)acrylic acid, α-chloro(meth)acrylic acid, β-furyl(meth)acrylic acid, β-styryl(meth)acrylic acid, maleic acid, maleic anhydride, maleic acid monoesters such as monomethyl maleate, monoethyl maleate and monoisopropyl maleate, fumaric acid, cinnamic acid, α-cyanocinnamic acid, itaconic acid, crotonic acid, and propiolic acid.

The above alkyl (meth)acrylates include those in which the alkyl group of the ester moiety is an alkyl group having 1 to 12 carbon atoms. Examples of such alkyl (meth)acrylates include methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate and 2-ethylhexyl (meth)acrylate, and structural isomers thereof. Furthermore, the alkyl group may have a substituent such as a hydroxyl group, an epoxy group or a halogen group.

It is preferable for the binder polymer to have a carboxyl group in the molecule from the viewpoint of an enhancement in alkali development property. The binder polymer having a carboxyl group can be produced by radical polymerization of a polymerizable monomer having a carboxyl group and other polymerizable monomer. The polymerizable monomer having a carboxyl group is preferably methacrylic acid. In particular, a binder polymer having an alkyl (meth)acrylate and (meth)acrylic acid as monomer units is preferable as the binder polymer.

In addition, it is preferable for the binder polymer to have styrene or a styrene derivative as a monomer unit from the viewpoint of enhancements in adhesiveness and chemical resistance (plating resistance). In order to use styrene or a styrene derivative as a copolymerization component to improve both of adhesiveness and peeling property, the binder polymer preferably includes 3 to 60% by mass of styrene or a styrene derivative, more preferably 4 to 55% by mass, further preferably 5 to 50% by mass. When the content of the monomer unit based on styrene or a styrene derivative is 3% by mass or more, adhesiveness tends to be enhanced, and when the content is 60% by mass or less, the development time tends to be shorter, a piece peeled tends to be smaller, and the peeling time tends to be shorter.

The weight average molecular weight of the binder polymer is preferably 30000 to 150000, more preferably 40000 to 120000. When the photosensitive element of the present embodiment is used in an etching application in which the thickness of the photosensitive layer is preferably thinner, the weight average molecular weight of the binder polymer is particularly preferably 80000 to 100000 from the viewpoint that film strength (tenting property) can be enhanced. On the other hand, when the photosensitive element is used in a plating application in which the thickness of the photosensitive layer is preferably thicker, the weight average molecular weight of the binder polymer is particularly preferably 40000 to 60000 from the viewpoint of the enhancement in peeling property of the photosensitive layer. When this weight average molecular weight is 30000 or more, the photosensitive layer tends to be hardly brittle, and when the weight average molecular weight is 150000 or less, a string-like development residue tends to be hardly generated to result in an enhancement in resolution. Herein, with respect to the weight average molecular weight, the value is used which is measured by gel permeation chromatography (hereinafter, designated as "GPC") and determined in terms of standard poly styrene.

The acid value of the binder polymer is preferably 30 to 300 mgKOH/g, more preferably 60 to 250 mgKOH/g, further preferably 100 to 200 mgKOH/g. When this acid value is 30 mgKOH/g or more, the development time tends to be shorter, and when the acid value is 300 mgKOH/g or less, the acidity of a resist photo-cured, to an alkaline developing solution, tends to be enhanced.

Such a binder polymer is used singly or in combination of two or more. Examples of a combination of two or more binder polymers in the case of using in combination include two or more binder polymers each including a different copolymerization component, two or more binder polymers each having a different weight average molecular weight, and two or more binder polymers each having a different dispersibility. In addition, a polymer having a multimode molecular weight distribution, described in JP 11-327137 A, can also be used.

Herein, in the case where development by an organic solvent is performed in a development step, it is preferable for the polymerizable monomer having a carboxyl group to be prepared in a small amount. If necessary, the binder polymer may also have a photosensitive group.

The photopolymerizable compound having an ethylenically unsaturated bond as the component (B) preferably contains a compound having 4 to 40 oxyalkylene units having 2 to 6 carbon atoms (alkylene glycol unit) in the molecule. The component (B) can contain such a compound to thereby enhance compatibility with the binder polymer (A).

Examples of the oxyalkylene unit having 2 to 6 carbon atoms include an oxyethylene unit, an oxypropylene unit, an oxyisopropylene unit, an oxybutylene unit, an oxypentylene unit and an oxyhexylene unit, and among them, an oxyethylene unit or an oxyisopropylene unit is preferable as the oxyalkylene unit from the viewpoint of enhancements in resolution and plating resistance.

In addition, among these photopolymerizable compounds, a bisphenol A-based (meth)acrylate compound or polyalkylene glycol di(meth)acrylate can be particularly preferably used from the viewpoint that the effects of the present invention tend to be able to be more certainly achieved.

Examples of the bisphenol A-based (meth)acrylate compound include a compound represented by formula (I).

where the value of p+q is 4 or more, the compatibility with the binder polymer as the component (A) is enhanced, and peeling is hardly made in lamination of the photosensitive element on a circuit-forming board. In addition, in the case where the value of p+q is 40 or less, hydrophilicity is decreased, a resist image is hardly peeled in development, and plating resistance to solder plating or the like is also easily enhanced. Then, the resolution of the photosensitive element tends to be enhanced in both the cases. In the case where p denotes 2 or more, two or more $X^1(s)$ adjacent to each other in the molecule may be each the same or different, and in the case where q denotes 2 or more, two or more $X^2(s)$ adjacent to each other in the molecule may be each the same or different. In addition, in the case where $X^1$ includes two or more alkylene groups, the structural unit of —(O—$X^1$)— may be present at random or in a blocking manner, and in the case where $X^2$ includes two or more alkylene groups, the structural unit of —($X^1$—O)— may be present at random or in a blocking manner.

In addition, an aromatic ring in formula (I) may have a substituent. Examples of such a substituent include a halogen atom, an alkyl group having 1 to 20 carbon atoms, a cycloalkyl group having 3 to 10 carbon atoms, an aryl group having 6 to 18 carbon atoms, a phenacyl group, amino group, an alkylamino group having 1 to 10 carbon atoms, a dialkylamino group having 2 to 20 carbon atoms, a nitro group, a cyano group, a carbonyl group, a mercapto group, an alkylmercapto group having 1 to 10 carbon atoms, an allyl group, a hydroxyl group, a hydroxyalkyl group having 1 to 20 carbon atoms, a carboxyl group, a carboxyalkyl group in which the number of carbon atoms in the alkyl group is 1 to 10, an acyl group in which the number of carbon atoms in the alkyl group is 1 to 10, an alkoxy group having 1 to 20 carbon atoms, an alkoxycarbonyl group having 1 to 20 carbon atoms, an alkylcarbonyl group having 2 to 10 carbon atoms, an alkenyl group having 2 to 10 carbon atoms, an N-alkylcarbamoyl group having 2 to 10 carbon atoms or a hetero ring containing group, and aryl groups substituted with such substituents. The substituents may form a condensed ring, or a hydrogen atom in such substituents may be substituted with any of the above substituents such as a halogen atom. Herein, when the number of the (I)

In formula (I), $R^1$ and $R^2$ each independently represent a hydrogen atom or a methyl group, preferably a methyl group. In formula (I), $X^1$ and $X^2$ each independently represent an alkylene group having 2 to 6 carbon atoms, and examples include an ethylene group, a propylene group, an isopropylene group, a butylene group, a pentylene group and a hexylene group. In particular, $X^1$ and $X^2$ are each preferably an ethylene group or a propylene group, more preferably an ethylene group, from the viewpoint of enhancements in resolution and plating resistance.

In formula (I), p and q each denote a positive integer selected so as to satisfy p+q=4 to 40. The value of p+q is preferably 6 to 34, more preferably 8 to 30, particularly preferably 8 to 28, very preferably 8 to 20, extremely preferably 8 to 16, particularly preferably 8 to 12. In the case substituents is 2 or more in each case, two or more substituents may be each the same or different.

Examples of the compound represented by formula (I) include bisphenol A-based (meth)acrylate compounds such as 2,2-bis(4-((meth)acryloyloxypolyethoxy)phenyl)propanes, 2,2-bis(4-((meth)acryloyloxypolypropoxy)phenyl)propanes, 2,2-bis(4-((meth)acryloyloxypolybutoxy)phenyl)propanes and 2,2-bis(4-((meth)acryloyloxypolyethoxypolypropoxy)phenyl)propanes.

Examples of 2,2-bis(4-((meth)acryloyloxypolyethoxy)phenyl)propanes include 2,2-bis(4-((meth)acryloyloxydiethoxy)phenyl)propane, 2,2-bis(4-((meth)acryloyloxytriethoxy)phenyl)propane, 2,2-bis(4-((meth)acryloyloxytetraethoxy)phenyl)propane, 2,2-bis(4-((meth)acryloyloxypentaethoxy)phenyl)propane, 2,2-bis(4-((meth)

acryloyloxyhexaethoxy)phenyl)propane, 2,2-bis(4-((meth)acryloyloxyheptaethoxy)phenyl)propane, 2,2-bis(4-((meth)acryloyloxyoctaethoxy)phenyl)propane, 2,2-bis(4-((meth)acryloyloxynonaethoxy)phenyl)propane, 2,2-bis(4-((meth)acryloyloxydecaethoxy)phenyl)propane, 2,2-bis(4-((meth)acryloyloxyundecaethoxy)phenyl)propane, 2,2-bis(4-((meth)acryloyloxydodecaethoxy)phenyl)propane, 2,2-bis(4-((meth)acryloyloxytridecaethoxy)phenyl)propane, 2,2-bis(4-((meth)acryloyloxytetradecaethoxy)phenyl)propane, 2,2-bis(4-((meth)acryloyloxypentadecaethoxy)phenyl)propane and 2,2-bis(4-((meth)acryloyloxyhexadecaethoxy)phenyl)propane. Among them, 2,2-bis(4-(methacryloxypentaethoxy)phenyl)propane can be commercially obtained as BPE-500 (product name, produced by Shin-Nakamura Chemical Co., Ltd.). In addition, 2,2-bis(4-(methacryloxypentadecaethoxy)phenyl)propane can be commercially obtained as BPE-1300 (product name, produced by Shin-Nakamura Chemical Co., Ltd.). These are used singly or in combination of two or more.

Examples of 2,2-bis(4-((meth)acryloyloxypolyethoxypolypropoxy)phenyl)propanes include 2,2-bis(4-((meth)acryloyloxydiethoxyoctapropoxy)phenyl)propane, 2,2-bis(4-((meth)acryloyloxytetraethoxytetrapropoxy)phenyl)propane and 2,2-bis(4-((meth)acryloyloxyhexaethoxyhexapropoxy)phenyl)propane. These are used singly or in combination of two or more.

Examples of polyalkylene glycol di(meth)acrylates preferably include a compound represented by formula (II).

(II)

In formula (II), $R^3$ and $R^4$ each independently represent a hydrogen atom or an alkyl group having 1 to 3 carbon atoms, preferably a methyl group. In formula (II), $Y^1$, $Y^2$ and $Y^3$ each independently represent an alkylene group having 2 to 6 carbon atoms, preferably an ethylene group or a propylene group. In formula (II), s, t and u each denote an integer of 0 to 30 selected so as to satisfy $s+t+u=4$ to 40. The value of $s+t+u$ is preferably 5 to 30, more preferably 8 to 23, particularly preferably 10 to 15. When this value of $s+t+u$ is 4 or more, the boiling point of the compound tends to be higher to weaken the odor of the photosensitive layer 20. In addition, when the value of $s+t+u$ is 40 or less, the concentration of a photo-reactive moiety per unit weight tends to be higher to thereby more easily provide a practical sensitivity.

In addition, in the case where the oxyalkylene units ($-(Y^1-O)_s-$, $-(Y^2-O)_t-$ and $-(Y^3-O)_u-$) in formula (II) include, for example, an oxyethylene unit and an oxypropylene unit, a plurality of oxyethylene units and oxypropylene units, if present, are not each required to be continuously present in a blocking manner and may be present at random.

Furthermore, in the case where the oxyalkylene unit is an oxyisopropylene unit, the secondary carbon of the propylene group may be bound to an oxygen atom or the primary carbon thereof may be bound to an oxygen atom.

Preferable examples of the compound represented by formula (II) include compounds represented by formulae (III), (IV) and (V). These are used singly or in combination of two or more.

(III)

In formula (III), $R^3$ and $R^4$ each independently represent a hydrogen atom or an alkyl group having 1 to 3 carbon atoms, EO represents an oxyethylene unit, PO represents an oxypropylene unit, and $m^1$, $m^2$ and $n^1$ each denote an integer of 1 to 30 selected so as to satisfy $m^1+m^2+n^1=4$ to 40.

(IV)

In formula (IV), $R^3$ and $R^4$ each independently represent a hydrogen atom or an alkyl group having 1 to 3 carbon atoms, EO represents an oxyethylene unit, PO represents an oxypropylene unit, and $m^3$, $n^2$ and $n^3$ each denote an integer of 1 to 30 selected so as to satisfy $m^3+n^2+n^3=4$ to 40.

(V)

In formula (V), $R^3$ and $R^4$ each independently represent a hydrogen atom or an alkyl group having 1 to 3 carbon atoms, EO represents an oxyethylene unit, PO represents an oxypropylene unit, and $m^4$ and $n^4$ each denote an integer of 1 to 30 selected so as to satisfy $m^4+n^4=4$ to 40.

Examples of the alkyl group having 1 to 3 carbon atoms in each of formulae (III), (IV) and (V) include a methyl group, an ethyl group, an n-propyl group and an isopropyl group.

In addition, the total numbers of repeating units of oxyethylene units in formulae (III), (IV) and (V) ($m^1+m^2$, $m^3$ and $m^4$) are each independently preferably an integer of 1 to 30, more preferably an integer of 1 to 10, further preferably an integer of 4 to 9, particularly preferably an integer of 5 to 8. When this number of repeating units is 30 or less, tent reliability and a resist shape tend to be easily enhanced.

The total numbers of repeating units of oxypropylene units in formulae (III), (IV) and (V) ($n^1$, $n^2+n^3$ and $n^4$) are each independently preferably an integer of 1 to 30, more preferably an integer of 5 to 20, further preferably an integer of 8 to 16, particularly preferably an integer of 10 to 14. When this number of repeating units is 30 or less, resolution tends to be enhanced to hardly generate sludge.

Specific examples of the compound represented by formula (III) include a vinyl compound in which $R^3$ and $R^4$ are each a methyl group, $m^1+m^2=4$ (average value), and $n^1=12$ (average value) (product name: FA-023M, produced by Hitachi Chemical Co., Ltd.).

Specific examples of the compound represented by formula (IV) include a vinyl compound in which $R^3$ and $R^4$ are each a methyl group, $m^3=6$ (average value), and $n^2+n^3=12$ (average value) (product name: FA-024M, produced by Hitachi Chemical Co., Ltd.).

Specific examples of the compound represented by formula (V) include a vinyl compound in which $R^3$ and $R^4$ are each a hydrogen atom, $m^4=1$ (average value), and $n^4=9$ (average value) (sample name: NK Ester HEMA-9P, produced by Shin-Nakamura Chemical Co., Ltd.).

Herein, these are used singly or in combination of two or more.

It is preferable for the component (B) to further contain other photopolymerizable compound having one ethylenically unsaturated bond, in addition to the photopolymerizable compound having a polymerizable ethylenically unsaturated bond in the molecule, described above. Examples of other photopolymerizable compound having one ethylenically unsaturated bond include nonylphenoxypolyalkyleneoxy (meth)acrylates such as nonylphenoxypolyethyleneoxy (meth)acrylate, nonylphenoxypolypropyleneoxy (meth)acrylate and nonylphenoxypolyethyleneoxypolypropyleneoxy (meth)acrylate, phthalic acid type compounds such as γ-chloro-β-hydroxypropyl-β'-(meth)acryloyloxyethyl-o-phthalate and β-hydroxyalkyl-β'-(meth)acryloyloxyalkyl-o-phthalate, and alkyl (meth)acrylates. The photopolymerizable compound having one ethylenically unsaturated bond can be contained to thereby enhance properties such as developing solution property and peeling property.

In addition, the photosensitive resin composition according to the present embodiment may contain a photopolymerizable compound other than the above-described photopolymerizable compound. Examples of such a photopolymerizable compound include a compound obtained by reacting α,β-unsaturated carboxylic acid with a glycidyl group-containing compound, and urethane monomers such as a (meth)acrylate compound having a urethane bond in the molecule.

Examples of the photopolymerization initiator as the component (C) include benzophenone; N,N'-tetraalkyl-4'-diaminobenzophenones such as N,N'-tetramethyl-4'-diaminobenzophenone (Michler's ketone); aromatic ketones such as 2-benzyl-2-dimethylamino-1-(4-morpholinophenyl)-butanone-1,2-methyl-1-[4-(methylthio)phenyl]-2-morpholinopropanone-1; quinone compounds such as alkyl anthraquinones; benzoinether compounds such as benzoinalkylethers; benzoin compounds such as benzoin and alkylbenzoins; benzyl derivatives such as benzyl dimethyl ketals; 2,4,5-triarylimidazole dimers such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, a 2-(o-methoxyphenyl)-4,5-diphenylimidazole dimer and a 2-(p-methoxyphenyl)-4,5-diphenylimidazole dimer; acridine derivatives such as 9-phenylacridine and 1,7-bis(9,9'-acridinyl)heptane; and N-phenylglycine, N-phenylglycine derivatives and coumarin type compounds. In addition, substituents of aryl groups of two 2,4,5-triarylimidazoles in 2,4,5-triarylimidazole dimers may afford the same symmetric compounds, or may afford different asymmetric compounds. Among them, 2,4,5-triarylimidazole dimers are preferable from the viewpoint of enhancements in adhesiveness and sensitivity. These are used singly or in combination of two or more.

The content of the binder polymer as the component (A) is preferably 40 to 70 parts by mass, more preferably 50 to 60 parts by mass based on 100 parts by mass of the total of the component (A) and the component (B). When this content is 40 parts by mass or more, a photo-cured product tends to be hardly brittle, and when the content is 70 parts by mass or less, sufficient resolution and photosensitivity tend to be easily achieved.

The content of the photopolymerizable compound having an ethylenically unsaturated bond, as the component (B) is preferably 30 to 60 parts by mass, more preferably 40 to 50 parts by mass based on 100 parts by mass of the total of the component (A) and the component (B). When this content is 30 parts by mass or more, sufficient resolution and photosensitivity tend to be easily achieved, and when the content is 60 parts by mass or less, a photo-cured product tends to be hardly brittle.

The content of the photopolymerization initiator as the component (C) is preferably 0.1 to 20 parts by mass, more preferably 0.2 to 10 parts by mass, particularly preferably 0.5 to 5 parts by mass based on 100 parts by mass of the total of the component (A) and the component (B). When this content is 0.1 parts by mass or more, a sufficient photosensitivity tends to be easily achieved, and when the content is 20 parts by mass or less, photoabsorption on the surface of the photosensitive resin composition during exposure tends to be hardly increased to sufficiently achieve photo-curing of the interior.

In addition, the photosensitive resin composition may contain if necessary additives such as a photopolymerizable compound having at least one cationically polymerizable cyclic ether group in the molecule (oxetane compound or the like), a cationic polymerization initiator, a dye such as malachite green, a photochromic agent such as tribromophenylsulfone or leucocrystal violet, a thermal coloring inhibitor, a plasticizer such as p-toluenesulfoneamide, a pigment, a filler, a defoaming agent, a flame retardant, a stabilizer, an adhesiveness-imparting agent, a leveling agent, a peeling promoter, an antioxidant, a flavoring agent, an imaging agent or a thermal crosslinking agent. These are used singly or in combination of two or more. These additives may be each contained in about 0.01 to 20 parts by mass based on 100 parts by mass of the total of the component (A) and the component (B) as long as the object of the present invention is not impaired.

The photosensitive resin composition can be if necessary dissolved in a solvent such as methanol, ethanol, acetone, methyl ethyl ketone, methylcellosolve, ethylcellosolve, toluene, N,N-dimethylformamide or propyleneglycol monomethylether, or a mixed solvent thereof to be prepared as a solution having a solid content of about 30 to 60% by mass.

The photosensitive layer 20 in the photosensitive element 1 of the present embodiment can be formed by coating the support film 10 with the above photosensitive resin composition and removing the solvent. Herein, as the coating method, for example, a known method such as roll coating, comma coating, gravure coating, air knife coating, die coating or bar coating can be adopted. In addition, removal of the solvent can be performed by, for example, a treatment at 70 to 150° C. for about 5 to 30 minutes. Herein, the solvent may remain in the photosensitive layer, and the amount of the remaining organic solvent in the photosensitive layer 20 is preferably 2% by mass or less from the viewpoint that diffusion of the organic solvent in the subsequent step is prevented.

The thickness of the photosensitive layer 20 thus formed, after drying, is 3 to 30 μm, preferably 5 to 25 μm. In the case where the photosensitive element of the present embodiment is used in an etching application, the thickness is more preferably 8 to 18 μm, particularly preferably 10 to 15 μm. When this thickness is 3 μm or more, there are the following tendencies: when the photosensitive layer is laminated on the circuit-forming board, failures are hardly generated, tenting property is excellent, a resist is hardly broken in the development and etching steps, and open failures are hardly generated, as well as the production yield of a printed-wiring board is enhanced. On the other hand, when the thickness is 30 μm or less, the resolution of the photosensitive layer 20 is enhanced and traveling of an etching liquid is improved, and thus the influence of side etching is smaller and therefore a high-density printed-wiring board tends to be easily produced. In addition, in the case where the photosensitive element of the present embodiment is used in a plating application, the thickness is more preferably 15 to 25 μm, particularly preferably 20 to 25 μm. When this thickness is 3 μm or more, there are the following tendencies: when the photosensitive layer is laminated on the circuit-forming board, failures are hardly generated, and a plating liquid is hardly overhung to thereby easily peel the photosensitive layer in peeling of the photosensitive layer after plating, as well as the production yield of a printed-wiring board is enhanced. On the other hand, when the thickness is 30 μm or less, the resolution of the photosensitive layer 20 tends to be enhanced to easily produce a high-density printed-wiring board.

The photosensitive element 1 may include a protective film (not illustrated) on the second main surface located opposite to the first main surface in contact with the support film 10, of the photosensitive layer 20. As the protective film, it is preferable to use a film so that the adhesion force between the photosensitive layer 20 and the protective film is smaller than the adhesion force between the photosensitive layer 20 and the support film 10, and it is preferable to use a low fisheye film. Specifically, examples include films of inert polyolefins such as polyethylene and polypropylene. A polyethylene film is preferable from the viewpoint of the enhancement in peeling property from the photosensitive layer 20. The thickness of the protective film, but being different depending on the application, is preferably 1 to 100 μm.

The photosensitive element 1 may also further include, in addition to the support film 10, the photosensitive layer 20 and the protective film, an intermediate layer or a protective layer such as a cushion layer, an adhesion layer, a light absorption layer or a gas barrier layer.

The photosensitive element 1 of the present embodiment may be stored as it is, or may be stored in the state where the photosensitive element 1 with the protective film further laminated on the photosensitive layer 20 is wound on a cylindrical winding core, for example. Here, it is preferable for winding to be made in a rolled manner so that the support film 10 is the outermost layer. In addition, it is preferable for an end surface separator to be provided on each of end surfaces of the photosensitive element 1 wound in a rolled manner from the viewpoint of protection of end surfaces, and it is preferable for a moisture-proof end surface separator to be provided from the viewpoint of edge fusion resistance. In addition, with respect to a packaging method, it is preferable for packaging to be made by wrapping with a black sheet low in moisture permeability.

Examples of the material of the winding core include plastics such as a polyethylene resin, a polypropylene resin, a polystyrene resin, a poly(vinyl chloride) resin and an ABS resin (acrylonitrile-butadiene-styrene copolymer).

(Method for Forming Resist Pattern)

A method for forming a resist pattern of the present embodiment is a method including a photosensitive layer formation step of using the photosensitive element 1 to form the photosensitive layer 20 on a circuit-forming board, an exposure step of irradiating the predetermined region of the photosensitive layer 20 with an active ray to form a photo-cured region on the photosensitive layer 20, and a development step of removing a region on the photosensitive layer 20, other than the photo-cured region. In the photosensitive layer formation step, lamination on the circuit-forming board may be made in order from the photosensitive layer 20 to the support film 10, to thereby form a photosensitive layer. That is, the method for forming a resist pattern of the present embodiment may be a method including a lamination step of laminating the photosensitive element 1 on the circuit-forming board in order from the photosensitive layer 20 to the support film 10, an exposure step of irradiating a predetermined region of the photosensitive layer 20 with an active ray through the support film 10 to form a photo-cured region on the photosensitive layer 20, and a development step of removing a region on the photosensitive layer 20, other than the photo-cured region.

In the photosensitive layer formation step, examples of the method for forming the photosensitive layer 20 on the circuit-forming board include, in the case where the protective film is present on the photosensitive layer 20 of the photosensitive element, a method including removing the protective film and then pressure-bonding the photosensitive layer 20 to the circuit-forming board at a pressure of 0.1 to 1 MPa with heating to 70 to 130° C., for laminating. In this photosensitive layer formation step, lamination can also be made under reduced pressure. Herein, the surface on which the photosensitive layer on the circuit-forming board is formed is usually, but not particularly limited to, a metal surface. In addition, in order to further enhance lamination property, the circuit-forming board may be pre-heat treated.

Then, in the exposure step, the photosensitive layer 20 formed in the photosensitive layer formation step is irradiated with an active ray, and a photo-cured region is formed on the photosensitive layer 20. Examples of the exposure method include a method for imagewise irradiating the layer with an active ray according to a direct writing exposure method, such as a method for imagewise irradiating the layer with an active ray with a photomask having a negative or positive mask pattern interposed (mask exposure method), a method for imagewise irradiating the layer with an active ray, to which the image of a photomask is projected, with a lens interposed (projection type exposure method), an LDI (Laser Direct Imaging) exposure method or a DLP (Digital Light Processing) exposure method. In the exposure step, the photosensitive layer 20 may be irradiated with an active ray through the support film 10, or the photosensitive layer 20 may be irradiated with an active ray after the support film 10 is removed. Herein, in the mask exposure method, exposure is made after alignment with the second main surface 14 of the support film 10. A known light source, for example, a carbon arc lamp, a mercury vapor arc lamp, a high-pressure mercury lamp, a xenon lamp, a gas laser such as an argon laser, a solid-state laser such as a YAG laser, one effectively emitting ultraviolet light such as a semiconductor laser or a gallium nitride-based violet laser, or one effectively emitting visible light, such as a photographic flood bulb or a sun lamp is used as the light source of the active ray.

In the projection type exposure method, when a projection type exposure machine whose numerical aperture is small is used, an image can be easily focused via a projector lens to accurately project the image on the circuit-forming board, even in the case where a fine line pattern having a resolution of less than 10 μm is formed. In addition, in the case where an image is hardly focused using a light source having different wavelengths, it is preferable to use a filter or the like to allow the light source to have a single wavelength, in order to form a fine line pattern having a higher resolution. Examples of the projection type exposure machine whose numerical aperture is small include UX-2240SM-XJ01 (manufactured by Ushio Inc., product name). The photosensitive element of the present embodiment can be used to thereby sufficiently exert the above effect even in the case where a projection type exposure machine whose numerical aperture is less than 0.1 is used.

Then, after the exposure step, the photomask is peeled from the support film 10. Furthermore, the support film 10 is peeled and removed from the photosensitive layer 20. Then, in the development step, an unexposed region (unphoto-cured region) of the photosensitive layer 20 can be removed and developed by wet development with a developing solution such as an aqueous alkaline solution, an aqueous developing solution or an organic solvent, dry development, or the like, to produce a resist pattern.

Examples of the aqueous alkaline solution include a 0.1 to 5% by mass sodium carbonate dilute solution, a 0.1 to 5% by mass potassium carbonate dilute solution and a 0.1 to 5% by mass sodium hydroxide dilute solution. The pH of the aqueous alkaline solution preferably ranges from 9 to 11, and the temperature is regulated depending on the development property of the photosensitive layer 20. In addition, a surfactant, a defoaming agent or an organic solvent may be mixed in the aqueous alkaline solution. In addition, examples of the development system include a dip system, a spray system, brushing and slapping.

In addition, with respect to the treatment after the development step, the resist pattern may be further cured by heating at 60 to 250° C. or exposure in an amount of energy of 0.2 to 10 $J/cm^2$, if necessary.

According to the above method, it is possible to form the resist pattern on a conductor layer on which a circuit pattern is formed. The resist pattern can be used as a solder resist for preventing a solder from being attached to an unnecessary region on the conductor layer in jointing of mounting components.

In addition, the resist pattern obtained by the above forming method may be used for forming on a rigid substrate a curing resin excellent in physical properties such as tensile strength and elongation rate and satisfactory in migration resistance, and is more preferably used as a permanent mask (solder resist) to be formed on a rigid substrate. Specifically, it is useful to use the resist pattern as a solder resist of a printed-wiring board provided with a rigid substrate, or a solder resist of a package substrate provided with a rigid substrate.

(Method for Producing Printed-Wiring Board)

A method for producing a printed-wiring board of the present embodiment is performed by etching or plating a circuit-forming board having a resist pattern formed by the method for forming a resist pattern. Herein, such etching or plating, to which the circuit-forming board is subjected, is performed by etching or plating the surface of the circuit-forming board according to a known method, with the resist pattern developed as a mask.

As an etching liquid for use in etching, for example, a cupric chloride solution, a ferric chloride solution or an alkaline etching solution can be used.

Examples of plating include copper plating, solder plating, nickel plating and gold plating.

After etching or plating is performed, the resist pattern can be peeled by, for example, an aqueous alkaline solution stronger than the aqueous alkaline solution used in development. As this aqueous strong alkaline solution, for example, an aqueous 1 to 10% by mass sodium hydroxide solution or an aqueous 1 to 10% by mass potassium hydroxide solution is used. In addition, examples of the peeling system include a dipping system and a spray system. Herein, the printed-wiring board on which the resist pattern is formed may be a multi-layer printed-wiring board, and may have a small diameter through hole.

In the case where a circuit-forming board provided with an insulating layer and a conductor layer formed on the insulating layer is subjected to plating, it is necessary to remove the conductor layer other than the pattern. Examples of this removal method include a method including light etching after peeling the resist pattern, and a method including performing solder-plating following the above plating, thereafter peeling the resist pattern to thereby mask a wiring region with a solder, and then treating the resultant with an etching liquid capable of etching only the conductor layer.

(Method for Producing Semiconductor Package Substrate)

The photosensitive element 1 of the present embodiment can also be used for a package substrate provided with a rigid substrate and an insulating film formed on the rigid substrate. In this case, the photo-cured region of the photosensitive layer may be used as the insulating film. In the case where the photo-cured region of the photosensitive layer is used as, for example, a solder resist for a semiconductor package, it is preferable to perform irradiation with ultraviolet light by a high-pressure mercury lamp or heating after completion of the development in the method for forming a resist pattern, for the purpose of enhancing solder heat resistance, chemical resistance, and the like. In the case of irradiation with ultraviolet light, the amount of irradiation can be adjusted if necessary, and irradiation can also be performed in an amount of irradiation of about 0.2 to 10 $J/cm^2$, for example. In addition, in the case where the resist pattern is heated, it is preferable to perform such heating in the range from about 100 to 170° C. for about 15 to 90 minutes. Furthermore, irradiation with ultraviolet light and heating can also be simultaneously performed, or any one thereof can be performed and then the other thereof can be performed. In the case where irradiation with ultraviolet light and heating are simultaneously performed, it is more preferable to perform heating at 60 to 150° C. from the viewpoint of effectively imparting solder heat resistance, chemical resistance, and the like.

This solder resist doubles with a protective film for wiring after subjecting the substrate to soldering and is excellent in physical properties such as tensile strength and elongation rate as well as in thermal impact resistance, and therefore is effective as a permanent mask for a semiconductor package.

The package substrate thus provided with the resist pattern, to which a semiconductor device and the like are thereafter mounted (for example, wire bonding and solder connection), is then loaded to an electronic instrument such as a personal computer.

According to the photosensitive element, the method for forming a resist pattern, and the methods for producing a printed-wiring board and a semiconductor package substrate of the present embodiment described above, the photosensitive element 1 includes, as the support film 10, a support film in which the haze is 0.01 to 1.0% and the total light transmittance is 90% or more. Thus, even in the case where a projection type exposure machine whose numerical aperture is small is used to irradiate the photosensitive layer 20 with an active ray, it is possible to form a photo-cured region in which light scattering in the support film 10 is suppressed to the minimum and generation of pinholes in the photosensitive layer 20 is sufficiently reduced. A resist pattern and a circuit pattern in a printed-wiring board, thus obtained, can also have sufficiently reduced microdefects of the pattern and it is thus possible to enhance the production yield of a printed-wiring board.

The present invention is described above in detail based on the embodiments thereof. The present invention, however, is not limited to the above embodiments. The present invention can be variously modified without departing from the scope thereof.

EXAMPLES

Hereinafter, the present invention is specifically described based on Examples, but the present invention is not limited thereto.

(Preparation of Photosensitive Resin Composition)

First, each binder polymer whose composition was shown in Table 1 below was synthesized according to Synthesis Example.

TABLE 1

|   |   |   | A-1 |
|---|---|---|---|
| (A) Component | Amount loaded in synthesis (g) | Methacrylic acid | 162 |
|   |   | Methyl methacrylate | 30 |
|   |   | Styrene | 270 |
|   |   | Benzyl methacrylate | 138 |
|   |   | Azobisisobutyronitrile | 5.40 |
|   | Mass ratio | Methacrylic acid | 27 |
|   |   | Methyl methacrylate | 5 |
|   |   | Styrene | 45 |
|   |   | Benzyl methacrylate | 23 |
|   | Properties | Weight average molecular weight | 45000 |
|   |   | Acid value (mgKOH/g) | 107 |

Synthesis Example

To a flask equipped with a stirrer, a reflux condenser, a thermometer, a dropping funnel and a nitrogen gas introduction tube was added 420 g of a mixed liquid of toluene and methylcellosolve in a mass ratio of 6:4, stirred with a nitrogen gas being blown, and heated to 80° C.

A solution in which predetermined materials shown in Table 1 were with the mixed liquid (hereinafter, referred to as "solution a") was dropped through a dropping funnel at a constant dropping rate over 4 hours, thereafter the dropping funnel was washed with 40 g of a mixed liquid of toluene and methylcellosolve in a mass ratio of 6:4, and the mixed liquid used for such washing was added to the flask. Then, stirring was made at 80° C. for 2 hours. Furthermore, a solution in which 1.0 g of azobisisobutyronitrile was dissolved in 40 g of a mixed liquid of toluene and methylcellosolve in a mass ratio of 6:4 was dropped into the flask at a constant dropping rate over 30 minutes, thereafter the dropping funnel was washed using 120 g of a mixed liquid of toluene and methylcellosolve in a mass ratio of 6:4, and the mixed liquid used in such washing was added to the flask. The solution after dropping was stirred at 80° C. for 3 hours. Then, the solution was heated to 90° C. over 30 minutes, kept warm at 90° C. for 2 hours, and then cooled to room temperature to provide a binder polymer solution as component (A). In the present specification, room temperature means 25° C.

Toluene was added to this binder polymer solution for preparation so that the non-volatile component concentration (solid content concentration) was 40% by mass. The weight average molecular weight of the binder polymer was measured and the result thereof was shown in Table 1. Herein, the weight average molecular weight was measured by the gel permeation chromatography (GPC) method and calculated by conversion using the calibration curve of standard polystyrene. The GPC conditions are shown below. The acid value was also measured according to the following measurement procedure and the result thereof was shown in Table 1.

(GPC Conditions)
Pump: Hitachi L-6000 Model (manufactured by Hitachi Ltd.)
Column: Gelpack GL-R420+Gelpack GL-R430+Gelpack GL-R440 (three columns in total) (all produced by Hitachi Chemical Co., Ltd., product names)
Eluent: tetrahydrofuran
Measurement temperature: 40° C.
Flow rate: 2.05 mL/min
Detector: Hitachi L-3300 Model RI (manufactured by Hitachi Ltd., product name)

(Measurement Method of Acid Value)

The binder polymer synthesized was weighed in a conical flask, a mixed solvent (mass ratio: toluene/methanol=70/30) was added thereto for dissolution, thereafter a phenol phthalein solution as an indicator was added thereto, and titration was made by a 0.1 N potassium hydroxide alcohol solution (f=1.00) to measure the acid value.

Respective components in respective amounts, shown in Table 2 below, were mixed to prepare a photosensitive resin composition. The amount of the binder polymer, in Table 2, is the mass of the non-volatile content (the amount of the solid content).

TABLE 2

| Component | Material | Amount (g) |
|---|---|---|
| (A) Component | A-1 (Solid content concentration 40%) | 57 |
| (B) Component | FA-321M (EO-modified bisphenol A dimethacrylate, produced by Hitachi Chemical Co., Ltd., product name) | 28 |
|   | BPE-200 (EO-modified bisphenol A dimethacrylate, produced by Shin-Nakamura Chemical Co., Ltd., product name) | 10 |
|   | FA-024M (EO, PO-modified dimethacrylate, produced by Hitachi Chemical Co., Ltd., product name) | 5 |
| (C) Component | 2-(o-Chlorophenyl)-4,5-diphenylimidazole dimer | 2.9 |
|   | 1-Phenyl-3-(4-methoxystyryl)-5-(4-methoxyphenyl)pyrazoline | 0.12 |
|   | 4-t-Butylcatechol | 0.023 |
| Other component | Leucocrystal violet | 0.5 |
|   | Malachite green | 0.03 |
| Solvent | Methanol | 5 |
|   | Acetone | 9 |
|   | Toluene | 5 |

Examples 1 to 2 and Comparative Examples 1 to 6

(Production of Photosensitive Element)

As the support film of each photosensitive element, each PET film shown in Table 3 below was prepared. The haze and the total light transmittance of each PET film were measured and the results thereof were shown in Table 3. Herein, the haze and the total light transmittance were measured using a haze meter NDH5000 (manufactured by Nippon Denshoku Industries Co., Ltd.). In addition, the haze was measured according to the method defined in JIS K 7136 (2000), and the total light transmittance was measured according to the method defined in JIS K 7361-1 (1997).

Then, each PET film was coated with the above photosensitive resin composition so that the thickness was uniform, and the resultant was dried using a hot air convection dryer at 100° C. for 2 minutes. After drying, a photosensitive layer was covered with a polyethylene protective film (produced by Tamapoly Co., Ltd., product name "NF-15", thickness: 20 µm) to provide a photosensitive element. Herein, the thickness of the photosensitive layer after drying was adjusted so that "Thickness of photosensitive layer" shown in Table 3 was achieved. In addition, in the case of a PET film whose front and rear surfaces were different in configuration from each other, the photosensitive layer was formed on the surface opposite to the resin layer.

(Production of Laminate)

The copper surface of a copper-clad laminated plate (produced by Hitachi Chemical Co., Ltd., product name "MLC-E-679") being a glass epoxy material where a copper foil (thickness: 35 µm) was laminated on each of both surfaces was roughened using Meek Etch Bond CZ-8100 (manufactured by Meck Co.,), washed with an acid and water, and then dried by a flow of air. The resulting copper-clad laminated plate was heated to 80° C., and the photosensitive element was laminated so that the photosensitive layer was in contact with the copper surface, while the protective film was being peeled. Thus, a laminate was obtained in which the copper-clad laminated plate, the photosensitive layer and the support film were laminated in this order. Lamination was performed at a pressure-bonding pressure of 0.4 MPa and at a rolling speed of 1.5 m/min using a heat roll at 120° C. Such a laminate was used as each test piece in each of the following tests shown.

(Measurement of Shortest Development Time)

The laminate was cut to 125 mm×200 mm in rectangular shape and used as a test piece for shortest development time measurement. After the PET film was peeled from the test piece for shortest development time measurement, the photosensitive layer not exposed was subjected to spray development at a pressure of 0.15 MPa using an aqueous 1% by mass sodium carbonate solution at 30° C., and the shortest time at which the removal of an unexposed region of 1 mm or more could be visually observed was defined as the shortest development time. The measurement results are shown in Table 3.

(Photosensitivity Measurement Test)

A phototool having a 41-step tablet (produced by Hitachi Chemical Co., Ltd.) as a negative was placed on the support film of the test piece, and the photosensitive layer was exposed using a projection type exposure machine (manufactured by Ushio Inc., product name "UX-2240SM-XJ01") having a high-pressure mercury lamp in a predetermined amount of irradiation energy so that the number of steps of the cured resist was 11 after development. Herein, exposure was made with the phototool and the support film interposed. The projection type exposure machine used is an apparatus in which the resolution of a lens is secured to be 5 µm.

Then, the support film was peeled, and spray development was conducted by an aqueous 1% by mass sodium carbonate solution at 30° C. for twice the shortest development time to remove the unexposed region. Then, the number of steps of the step tablet of the photo-cured film formed on the copper-clad laminated plate was confirmed to be 11, and the predetermined amount of irradiation energy of the film was defined. The results are shown in Table 3.

(Adhesiveness and Resolution Measurement Tests)

In order to evaluate the adhesiveness, a phototool having a 41-step tablet (produced by Hitachi Chemical Co., Ltd.), a glass chromium-type phototool having a wiring pattern with a line width/space width (hereinafter, referred to as "L/S") of x/3x (x=2, 3, 4, 5, 6, 7, 8, 9, 10, 11, 12, 13, 14, 15, 16, 17, 18, 19, 20) (unit: µm) as a negative for adhesiveness evaluation, and a projection type exposure machine (manufactured by Ushio Inc., product name "UX-2240SM-XJ01") having a high-pressure mercury lamp were used to perform exposure in an amount of irradiation energy so that the number of steps remaining after development of the 41-step tablet was 11. Then, the support film was peeled, and spray development was conducted by an aqueous 1% by mass sodium carbonate solution at 30° C. for twice the shortest development time to remove the unexposed region. After the development treatment, the value of the smallest line width of the resist pattern in which the space region (unexposed region) was clearly removed and the line region (exposed region) was formed without failures caused, such as waving, cracking and peeling, was defined as the indicator of adhesiveness evaluation. It is meant that as this value is smaller, the adhesiveness is better. The results are shown in Table 3. Herein, the presence of failures in the resulting resist pattern was confirmed by observation at a magnification of 1000 using a microscope.

In order to evaluate the resolution, a phototool having a 41-step tablet (produced by Hitachi Chemical Co., Ltd.), a glass chromium-type phototool having a wiring pattern with a line width/space width of x/x (x=2, 3, 4, 5, 6, 7, 8, 9, 10, 11, 12, 13, 14, 15, 16, 17, 18, 19, 20) (unit: µm) as a negative for resolution evaluation, and a projection type exposure machine (manufactured by Ushio Inc., product name "UX-2240SM-XJ01") having a high-pressure mercury lamp were used to perform exposure in an amount of irradiation energy so that the number of steps remaining after development of the 41-step tablet was 11. Then, development was conducted by the same method as in adhesiveness evaluation. After the development treatment, the smallest L/S value of the resist pattern in which the space region (unexposed region) was clearly removed and the line region (exposed region) was formed without failures caused, such as waving, cracking and peeling, was defined as the indicator of adhesiveness evaluation. It is meant that as this value is smaller, the resolution is higher. The results are shown in Table 3. Herein, the presence of failures in the resulting resist pattern was confirmed by observation at a magnification of 1000 using a microscope.

(Evaluation of Pinhole Generation Property)

Figure 2:
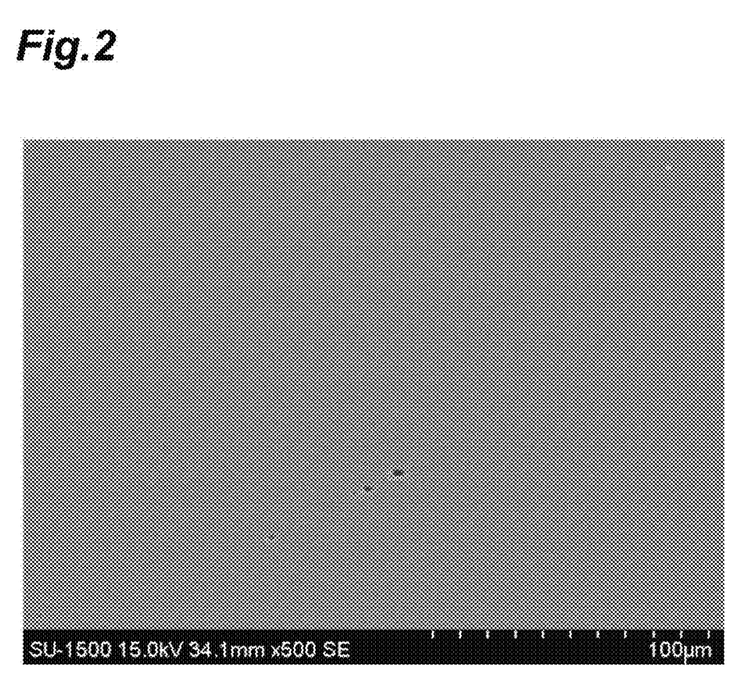
FIG. 2 is a scanning microscopic photograph of a resist surface on which pinholes are generated after development.

FIG. 2 is a scanning microscopic photograph of a resist surface on which pinholes are generated after development. The substrate subjected to evaluation of the adhesiveness and resolution measurement tests was used, and the number of pinholes having a diameter of 2 µm or more on the surface of the exposed region (also referred to as "resist line") of the photosensitive layer, shown in FIG. 2, was measured using a scanning electron microscope SU-1500 (manufactured by Hitachi Ltd.) with the visual field for observation at a magnification of 500 and at an inclination of a sample stage of 60 degrees being assumed as one visual field (the photograph shown in FIG. 2 was assumed as one visual field). The pinhole generation property was rated according to the following criteria. Observation was performed in 10 visual fields at random, and then the average value was calculated for evaluation. The results are shown in Table 3.

A: less than 0.1 pinholes
B: 0.1 or more and less than 1.0 pinhole
C: 1.0 or more and less than 10 pinholes
D: 10 or more pinholes

TABLE 3

|  |  | Example | | Comparative Example | | | | | |
|---|---|---|---|---|---|---|---|---|---|
|  |  | 1 | 2 | 1 | 2 | 3 | 4 | 5 | 6 |
| Support film | Product name | U32 | U48 | FB40 | QS48 | A1517 | A4100 | U40 | G2H |
|  | Thickness (μm) | 50 | 50 | 16 | 16 | 16 | 50 | 50 | 16 |
|  | Total light transmittance (%) | 92 | 91 | 89 | 88 | 89 | 89 | 91 | 88 |
|  | Haze | 0.7 | 0.9 | 0.7 | 0.6 | 0.6 | 0.6 | 1.4 | 2.5 |
| Thickness of photosensitive layer (μm) | | 25 | 25 | 25 | 25 | 25 | 25 | 25 | 25 |
| Shortest development time (sec) | | 20 | 20 | 20 | 20 | 20 | 20 | 20 | 20 |
| Amount of irradiation energy (mJ/cm$^2$) | | 90 | 90 | 90 | 90 | 90 | 90 | 90 | 90 |
| Adhesiveness (μm) | | 6 | 6 | 6 | 6 | 6 | 6 | 6 | 6 |
| Resolution (μm) | | 6 | 6 | 6 | 6 | 6 | 6 | 6 | 7 |
| Generation of pinholes | | A | A | B | B | C | C | B | D |

Figure 3:
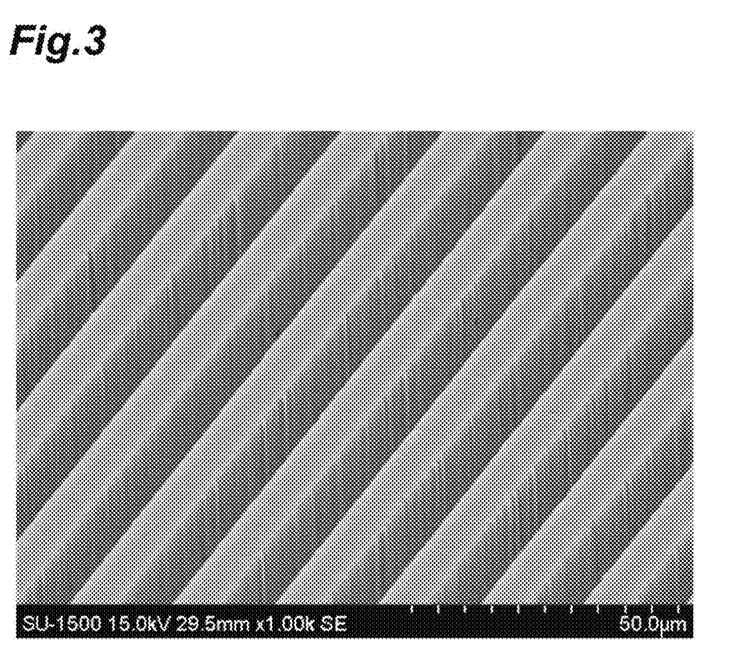
FIG. 3 is a scanning microscopic photograph of a side wall shape of a resist after development in Example 1.
Figure 4:
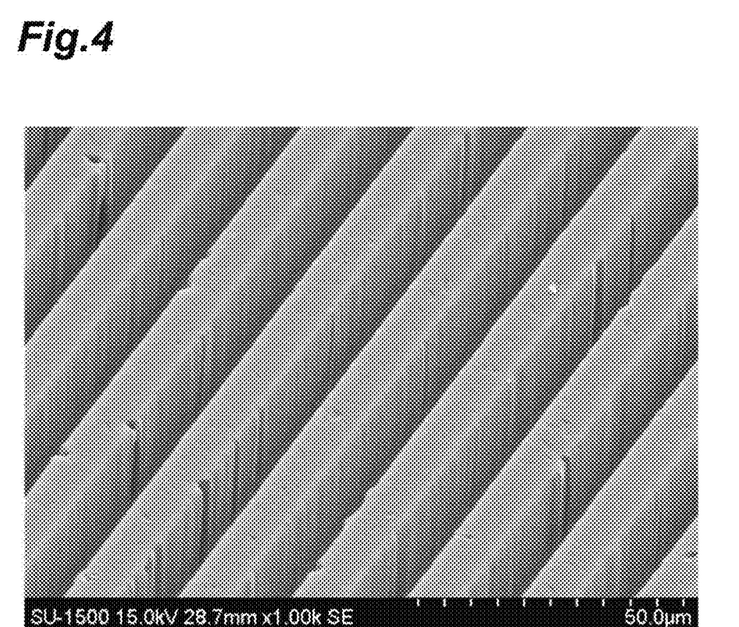
FIG. 4 is a scanning microscopic photograph of a side wall shape of a resist after development in Comparative Example 6.

U32: biaxially oriented PET film of trilayer structure, having particle-containing resin layer on each of both surfaces thereof, produced by Toray Industries Inc.
U48: biaxially oriented PET film of trilayer structure, having particle-containing resin layer on each of both surfaces thereof, produced by Toray Industries Inc.
FB40: biaxially oriented PET film of trilayer structure, having particle-containing resin layer on each of both surfaces thereof, produced by Toray Industries Inc.
QS48: biaxially oriented PET film of trilayer structure, having particle-containing resin layer on each of both surfaces thereof, produced by Toray Industries Inc.
A1517: biaxially oriented PET film of bilayer structure, having particle-containing resin layer on one surface thereof, produced by Toyobo Co., Ltd.
A4100: biaxially oriented PET film of bilayer structure, having particle-containing resin layer on one surface thereof, produced by Toyobo Co., Ltd.
U40: biaxially oriented PET film of trilayer structure, having particle-containing resin layer on each of both surfaces thereof, produced by Toray Industries Inc.
G2H: biaxially oriented PET film of monolayer structure, containing particle, produced by Teijin DuPont Films Japan Limited FIG. 3 is a scanning microscopic photograph of a side wall shape of a resist after development in Example 1, and FIG. 4 is a scanning microscopic photograph of a side wall shape of a resist after development in Comparative Example 6. It can be seen that generation of pinholes is sufficiently suppressed in the resist in Example 1 as illustrated in FIG. 3 as compared with in the resist in Comparative Example 6 as illustrated in FIG. 4.

According to the present invention, it is possible to provide a photosensitive element that enables generation of pinholes to be sufficiently suppressed even in the case where a projection type exposure machine whose numerical aperture is small is used.

What is claimed is:

1. A method for forming a resist pattern, comprising:
a photosensitive layer formation step of using a photosensitive element to form a photosensitive layer on a circuit-forming board, the photosensitive element comprising a support film and the photosensitive layer formed on the support film, wherein a thickness of the support film is 5 to 200 μm, a haze of the support film is 0.01 to 1.0%, a total light transmittance of the support film is 90% or more, and the photosensitive layer comprises a binder polymer, a photopolymerizable compound having an ethylenically unsaturated bond, and a photopolymerization initiator;
an exposure step of using a projection exposure machine having a numerical aperture of less than 0.1 to irradiate a predetermined region of the photosensitive layer with an active ray to form a photo-cured region; and
a development step of removing an unexposed region other than the photo-cured region.

2. A method for producing a printed-wiring board, comprising a step of etching or plating a circuit-forming board having a resist pattern formed by the method for forming a resist pattern according to claim 1.

3. The method according to claim 1, wherein the resist pattern has a resolution of less 10 μm.

4. A method for forming a resist pattern, comprising:
a lamination step of laminating a photosensitive element on a circuit-forming board, the photosensitive element comprising a support film and a photosensitive layer formed on the support film, the laminating being in order from the photosensitive layer to the support film, wherein a thickness of the support film is 5 to 200 μm, a haze of the support film is 0.01 to 1.0%, a total light transmittance of the support film is 90% or more, and the photosensitive layer comprises a binder polymer, a photopolymerizable compound having an ethylenically unsaturated bond, and a photopolymerization initiator;
an exposure step of using a projection exposure machine having a numerical aperture of less than 0.1 to irradiate a predetermined region of the photosensitive layer with an active ray through the support film to form a photo-cured region; and
a development step of removing an unexposed region other than the photo-cured region.

5. A method for producing a printed-wiring board, comprising a step of etching or plating a circuit-forming board having a resist pattern formed by the method for forming a resist pattern according to claim 4.

6. The method according to claim 4, wherein the resist pattern has a resolution of less 10 μm.

7. A method for forming a resist pattern, comprising:
a photosensitive layer formation step of using a photosensitive element to form a photosensitive layer on a circuit-forming board, the photosensitive element comprising a support film and the photosensitive layer formed on the support film, wherein a thickness of the support film is 5 to 200 μm, a haze of the support film is 0.01 to 1.0%, a total light transmittance of the support film is 90% or more, and the photosensitive layer comprises a binder polymer, a photopolymerizable compound having an ethylenically unsaturated bond, and a photopolymerization initiator;

an exposure step using a projection exposure machine having a numerical aperture of less than 0.1 to irradiate a predetermined region of the photosensitive layer with an active ray to form a photo-cured region; and a development step of removing an unexposed region other than the photo-cured region.

8. A method for producing a printed-wiring board, comprising a step of etching or plating a circuit-forming board having a resist pattern formed by the method for forming a resist pattern according to claim 7.

9. The method according to claim 7, wherein the resist pattern has a resolution of less 10 μm.

10. A method for forming a resist pattern, comprising:

a lamination step of laminating a photosensitive element on a circuit-forming board, the photosensitive element comprising a support film and a photosensitive layer formed on the support film, the lamination step including laminating the photosensitive element on the circuit-forming board in order from the photosensitive layer to the support film, wherein a thickness of the support film is 5 to 200 μm, a haze of the support film is 0.01 to 1.0%, a total light transmittance of the support film is 90% or more, and the photosensitive layer comprises a binder polymer, a photopolymerizable compound having an ethylenically unsaturated bond, and a photopolymerization initiator;

an exposure step using a projection exposure machine having a numerical aperture of less than 0.1 to irradiate a predetermined region of the photosensitive layer with an active ray through the support film to form a photo-cured region; and a development step of removing an unexposed region other than the photo-cured region.

11. A method for producing a printed-wiring board, comprising a step of etching or plating a circuit-forming board having a resist pattern formed by the method for forming a resist pattern according to claim 10.

12. The method according to claim 10, wherein the resist pattern has a resolution of less 10 μm.

* * * * *